United States Patent
Koike et al.

(10) Patent No.: US 6,940,011 B2
(45) Date of Patent: Sep. 6, 2005

(54) HIGH VOLTAGE ELECTRICAL PACKAGING BOX STRUCTURE

(75) Inventors: Hirotomo Koike, Wako (JP); Harumi Takedomi, Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 326 days.

(21) Appl. No.: 10/290,945

(22) Filed: Nov. 8, 2002

(65) Prior Publication Data

US 2003/0099095 A1 May 29, 2003

(30) Foreign Application Priority Data

Nov. 16, 2001 (JP) .......................... 2001-352314

(51) Int. Cl.$^7$ .............................. H02G 3/08; H02G 3/14
(52) U.S. Cl. ............................ 174/50; 174/57; 174/66; 439/76.2
(58) Field of Search .............................. 174/50, 53, 57, 174/58, 17 R, 66, 67; 220/3.2, 3.3, 3.4, 3.6, 3.7, 3.8, 3.9; 439/76.1, 949, 76.2, 723; 361/600, 679, 715, 708, 601, 690

(56) References Cited

U.S. PATENT DOCUMENTS

| | | | | |
|---|---|---|---|---|
| 3,666,134 A | * | 5/1972 | Rauch ........................ | 174/50 |
| 4,785,376 A | | 11/1988 | Dively | |
| 5,382,752 A | * | 1/1995 | Reyhan et al. ................ | 174/50 |
| 5,532,426 A | | 7/1996 | Blum et al. | |
| 5,722,851 A | * | 3/1998 | Onizuka et al. ........... | 439/76.2 |
| 5,795,193 A | * | 8/1998 | Yang ........................... | 439/723 |
| 5,822,189 A | * | 10/1998 | Isshiki ........................ | 439/76.2 |
| 5,864,091 A | * | 1/1999 | Sumida ........................ | 174/50 |
| 5,995,380 A | * | 11/1999 | Maue et al. ................ | 439/76.2 |
| 6,056,077 A | | 5/2000 | Kobayashi | |
| 6,066,802 A | | 5/2000 | Reinke et al. | |
| 6,069,315 A | * | 5/2000 | Tang ............................ | 174/50 |
| 6,108,202 A | * | 8/2000 | Sumida ...................... | 361/690 |
| 6,126,458 A | * | 10/2000 | Gregory, II et al. ........ | 439/76.2 |
| 6,189,635 B1 | | 2/2001 | Schuler et al. | |
| 6,515,226 B2 | * | 2/2003 | Chiriku et al. ................ | 174/50 |
| 6,545,217 B2 | * | 4/2003 | Sato ............................ | 174/50 |
| 6,545,861 B1 | * | 4/2003 | Hayes et al. ................ | 439/76.2 |

FOREIGN PATENT DOCUMENTS

| | | |
|---|---|---|
| FR | 2 480 059 | 10/1981 |
| JP | 55-170827 | 5/1979 |
| JP | 08-111592 | 4/1996 |
| JP | 08-130382 | 5/1996 |
| JP | 2002-46480 | 2/2002 |

* cited by examiner

Primary Examiner—Anthony Dinkins
Assistant Examiner—Angel R. Estrada
(74) Attorney, Agent, or Firm—Hamre, Schulman, Mueller & Larson, P.C.

(57) ABSTRACT

A high voltage electrical packaging box structure includes a case member having an opening portion, and a cover member which is detachably attached to the case member so as to cover the opening portion of the case member. The case member is installed so that a plane of the opening portion is inclined with respect to a horizontal plane. In the high voltage electrical packaging box structure, a pawl member is provided on one of the case member and the cover member, and a receiving member, which engages with the pawl member, is provided on the other one of the case member and the cover member.

9 Claims, 12 Drawing Sheets

HIGH VOLTAGE ELECTRICAL PACKAGING BOX STRUCTURE

BACKGROUND OF THE INVENTION

1. Field of the Invention

The present invention relates to a high voltage electrical packaging box structure. More specifically, the present invention relates to a high voltage electrical packaging box structure with improved workability, such as ease of maintenance.

2. Description of Related Art

A high voltage electrical packaging box in which electronic parts, such as a battery and a control device for electric vehicles or hybrid vehicles are accommodated may have a case member having an opening portion in which the electronic parts are placed, and a cover member detachably attached to the case member so as to cover the opening portion of the case member. In such a high voltage electrical packaging box, in general, the opening portion of the case member is covered by the cover member which is attached to the case member, and the cover member is detached from the case member when it is necessary to perform some sort of work on the electronic parts, such as maintenance.

The inventors of the present invention considered, in order to efficiently place the above-mentioned high voltage electrical packaging box in a vehicle, to place the high voltage electrical packaging box along a backrest of the rear seat. It is necessary, in order to place the high voltage electrical packaging box in the above-mentioned manner, to place the case member in an inclined state with respect to the horizontal plane so that the opening portion thereof faces the rear seat. It is also necessary to attach the cover member so as to cover the opening portion, and to place the back of the rear seat in front of the cover member. When it becomes necessary to perform some work on the electronic parts accommodated in the case member, the back of the rear seat and subsequently the cover member are removed, and the work is performed on the electronic parts in the case member through the opening portion thereof.

However, if the case member is placed so that the opening portion thereof is inclined with respect to the horizontal plane, a worker must carry out attaching and detaching operations, such as screwing and unscrewing operations, for the cover member while supporting the weight of the cover member when the cover member is attached and detached to/from the case member. Accordingly, problems, such as reduced workability, are expected to arise. That is, if the worker does not support the weight of the cover member during the operation of removing the cover member from the case member, there is the possibility that the cover member may be dropped and damaged. Also, if the worker does not support the weight of the cover member when the cover member is attached to the case member, the position of the fixing portions may shift with respect to each other, and the cover member cannot be attached to the case member using screws, for instance.

SUMMARY OF THE INVENTION

Accordingly, an object of the invention is to provide a high voltage electrical packaging box structure by which the workability for attaching and detaching the cover member to/from the case member is improved even when the case member is placed in a state in which the opening portion thereof is inclined with respect to the horizontal plane.

In order to achieve the above object, the present invention provides a high voltage electrical packaging box structure including a case member (for instance, a case member 51 in the embodiment described later) having an opening portion (for instance, an opening portion 100 in the embodiment described later), the case member being installed so that the plane of the opening portion is inclined with respect to the horizontal plane; and a cover member (for instance, a cover member 52 in the embodiment described later) which is detachably attached to the case member so as to cover the opening portion of the case member, wherein a pawl member (for instance, a pawl member 114 in the embodiment described later) is provided on one of the case member and the cover member, and a receiving member (for instance, a receiving member 120 in the embodiment described later), which is engaged with the pawl member, is provided on the other one of the case member and the cover member.

According to the above high voltage electrical packaging box structure, even if a worker does not support the weight of the cover member when the screws are unscrewed to remove the cover member from the case member, the cover member does not drop and become damaged since the pawl member formed on one of the case member and the cover member is engaged with the receiving member formed on the other one of the case member and the cover member. That is, the cover member can be temporarily fixed to the case member, prior to attaching the cover member to the case member using the screws, by engaging the pawl member formed on one of the case member and the cover member with the receiving member formed on the other one of the case member and the cover member. Accordingly, the worker can perform screwing and unscrewing operations without supporting the weight of the cover member during these operations.

In accordance with another aspect of the present invention, the case member further comprises a flange portion (for instance, a side flange portion 104 in the embodiment described later) extending in a lateral direction, and one of the pawl member and the receiving member is provided on the flange portion.

According to the above high voltage electrical packaging box structure, since one of the pawl member and the receiving member is provided at the flange portion extending in the lateral direction of the case member, it becomes possible to dispose the pawl member or the receiving member at a location separated from the space enclosed by the case member and the cover member. Accordingly, there is no danger that the space will be opened to the outside.

In accordance with another aspect of the present invention, the cover member further comprises a flange portion (for instance, a side flange portion 114 in the embodiment described later) extending in a lateral direction, and one of the pawl member and the receiving member is provided on the flange portion.

According to the above high voltage electrical packaging box structure, since one of the pawl member and the receiving member is provided on the flange portion extending in the lateral direction of the cover member, it becomes possible to dispose the pawl member or the receiving member at a location separated from the space enclosed by the case member and the cover member. Accordingly, there is no danger that the space portion will be opened to the outside.

In accordance with yet another aspect of the present invention, the case member further comprises a flange portion extending in a lateral direction, and the receiving member is provided on the flange portion as a bead raised from the flange portion.

In accordance with yet another aspect of the present invention, the cover member further comprises a flange portion extending in a lateral direction, and the receiving member is provided on the flange portion as a bead raised from the flange portion.

According to the above high voltage electrical packaging box structure, since the receiving member is provided on the flange portion as a bead raised from the flange portion, the receiving member reinforces the flange portion.

In accordance with yet another aspect of the present invention, the above high voltage electrical packaging box further includes a sealing member having elasticity (for instance, a sealing member 127 in the embodiment described later) which is disposed between a periphery of the opening portion of the case member and the cover member. Also, in accordance with yet another aspect of the present invention, the pawl member and the receiving member are disposed at a substantially central position in the height direction of the case member and of the cover member.

According to the above high voltage electrical packaging box structure, since the sealing member having elasticity is provided between the periphery of the opening portion of the case member and the cover member, the cover member is subjected to a force pushing it away, due to the elasticity of the sealing member, when the cover member is temporarily fixed to the case member by the pawl member and the receiving member. However, since the pawl member and the receiving member are respectively disposed at a substantially central position in the height direction of the case member and the cover member, the force pushing it away from the sealing member can be evenly received.

In accordance with yet another aspect of the present invention, the above high voltage electrical packaging box structure is placed between the rear seat and the trunk of a vehicle. Also, in accordance with yet another aspect of the present invention, the above high voltage electrical packaging box structure is applied to a cooling device.

According to the above high voltage electrical packaging box structure, since it is possible to efficiently place the cooling device, to which the high voltage electrical packaging box structure is applied, between the backrest of the rear seat and the trunk of the vehicle, it becomes possible to use the available space in the vehicle in an efficient manner. Also, when it becomes necessary to perform some work on the electronic parts accommodated in the case member of the high voltage electrical packaging cooling device, the back of the rear seat and the cover member may be removed in an efficient manner, and work may be performed on the electronic parts in the case member through the opening portion thereof.

BRIEF DESCRIPTION OF THE DRAWINGS

Some of the features and advantages of the invention have been described, and others will become apparent from the detailed description which follows and from the accompanying drawings, in which.

DETAILED DESCRIPTION OF THE INVENTION

The invention summarized above and defined by the enumerated claims may be better understood by referring to the following detailed description, which should be read with reference to the accompanying drawings. This detailed description of particular preferred embodiments, set out below to enable one to build and use particular implementations of the invention, is not intended to limit the enumerated claims, but to serve as particular examples thereof.

Hereinafter, a high voltage electrical packaging box structure according to an embodiment of the present invention will be described with reference to the attached drawings.

The high voltage electrical packaging box structure according to this embodiment is applied to a high voltage electrical packaging cooling device for a vehicle. Note that the vehicle used in this embodiment is a hybrid vehicle. In hybrid vehicles, direct current is converted into alternating current by an inverter when being supplied to a motor from a direct current power source battery. Also, when a part of the output from the engine or the kinetic energy is to be stored in the battery via a motor, alternating current is converted into direct current by an inverter. Moreover, since the voltage of the direct current converted by the inverter is high, voltage of a part of the stored energy is reduced using a DC/DC converter. The high voltage electrical packaging cooling device is used to cool down the battery, the inverter, and the DC/DC converter.

Figure 1:
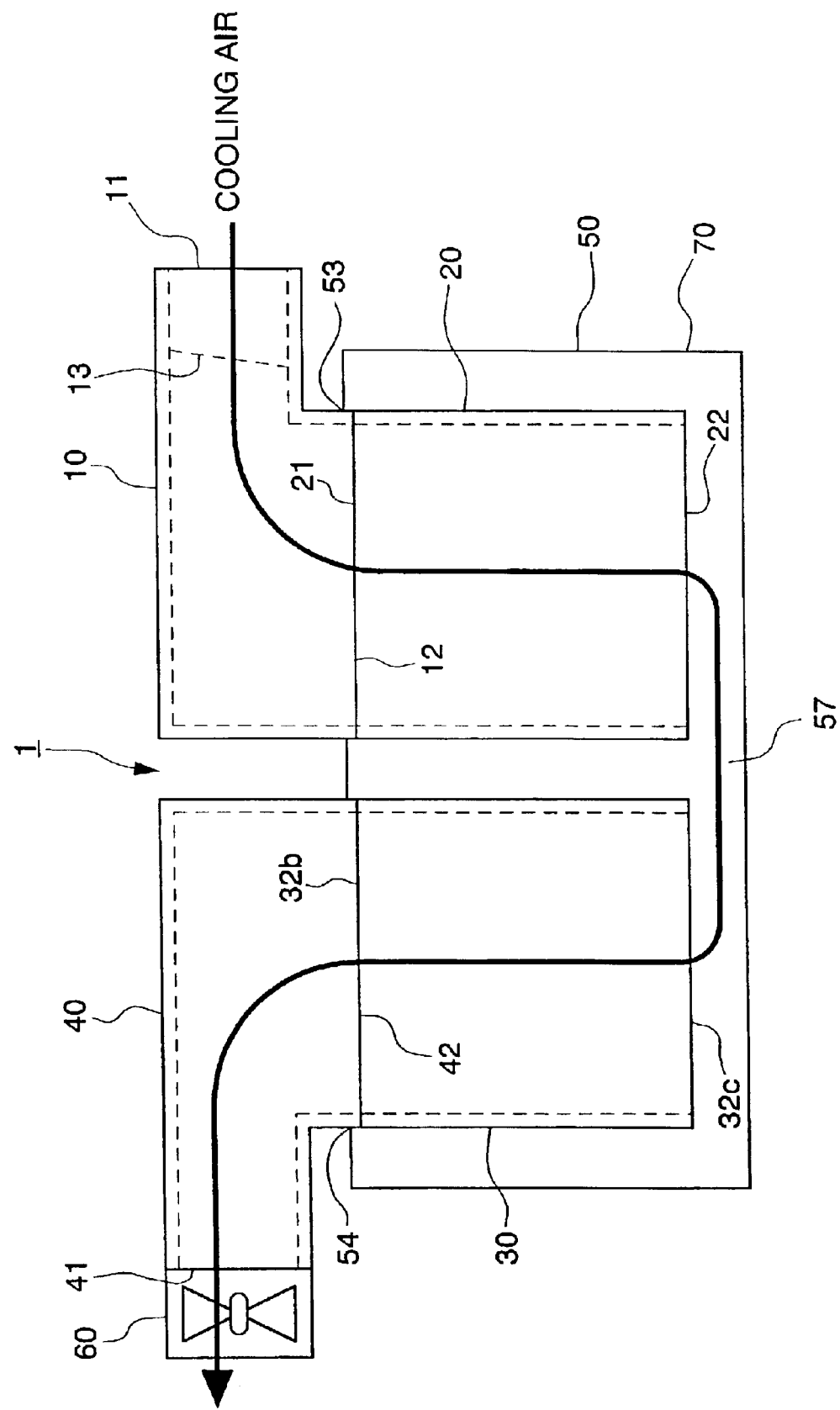
FIG. 1 is a schematic diagram showing a high voltage electrical packaging cooling device for a vehicle to which a high voltage electrical packaging box structure according to an embodiment of the present invention is applied.

Next, the high voltage electrical packaging cooling device 1 to which the high voltage electrical packaging box structure according to the embodiment of the present invention is applied will be explained with reference to FIG. 1.

The high voltage electrical packaging cooling device 1 includes an air-intake duct 10, a battery box 20, a heat sink case 30, an air-exhaust duct 40, an exterior box 50, and a fan 60. Also, a high voltage electrical packaging box 70 includes the battery box 20, the heat sink case 30, and the exterior box 50.

The air-intake duct 10 includes a cooling air inlet 11 which may be opened and closed by a shutter 13. The battery box 20, which has a box shape, includes an upper opening 21 that is connected to a lower opening 12 of the air-intake duct 10. A battery (not shown in FIG. 1) is placed in the battery box 20 through which cooling air flows. The heat sink 30, which also has a box shape, includes an upper opening 32b that is connected to a lower opening 42 of the air-exhaust duct 40. A heat sink is disposed in the heat sink case 30 through which the cooling air flows. Also, an inverter (not shown in FIG. 1) and a DC/DC converter (not shown in FIG. 1) are disposed outside the heat sink case 30.

The battery box 20, the heat sink case 30, the inverter, and the DC/DC converter are surrounded by the exterior box 50. The exterior box 50 is a closed box having openings 53 and 54 at the upper portion thereof The opening 53 is sealed with the joint portion of the lower opening 12 of the air-intake duct 10 and the upper opening 21 of the battery box 20 whereas the opening 54 is sealed with the joint portion of the lower opening 42 of the air-intake duct 40 and the upper opening 32b of the heat sink case 30. Also, a lower opening 22 of the battery box 20 and a lower opening 32c of the heat sink case 30 are communicated via the internal space of the exterior box 50.

The air-exhaust duct 40 includes a cooling air outlet 41, and a fan 60 is disposed at the cooling air outlet 41. Also, the operation of the fan 60 is connected with that of the shutter 13, and the shutter 13 opens when the fan 60 rotates, and closes when the fan 60 stops.

In the high voltage electrical packaging cooling device 1 including the above-mentioned configuration, the shutter 13 opens when the fan 60 rotates so that cooling air is introduced into the air-intake duct 10 via the cooling air inlet 11. The cooling air introduced into the air-intake duct 10 is exhausted to the outside of the exterior box 50 through the battery box 20. When the cooling air passes through the battery box 20, it exchanges heat with the battery, and as a result, the battery is cooled. The cooling air, the temperature of which is somewhat increased, passes into the exterior box 50. Note that since the battery is controlled so as to maintain a low temperature, the temperature of the cooling air after passing into the exterior box 50 is still sufficiently low to cool down the inverter and the DC/DC converter.

Since the exterior box 50 is a closed box, the cooling air passing into the exterior box 50 is introduced into the heat sink case 30. That is, the inside of the exterior box 50 functions as a cooling air passage 57 through which the cooling air is introduced to the inverter after cooling the battery. The cooling air introduced into the heat sink case 30 is then introduced to the air-exhaust duct 40 passing through the inside of the heat sink case 30, and then exhausted to the outside via the cooling air outlet 41 by the operation of the fan 60. The cooling air exchanges heat with the heat sink when it passes through the inside of the heat sink case 30. Since the heat of the inverter and of the DC/DC converter is transmitted to the heat sink via the heat sink case 30, the inverter and the DC/DC converter are cooled down by the heat exchange process between the cooling air and the heat sink.

Next, a high voltage electrical packaging cooling device to which the high voltage electrical packaging box structure according to the embodiment of the present invention is applied will be explained in detail with reference to FIGS. 2 through 10. Note that in FIGS. 2 through 10, elements which are the same as those in FIG. 1 are indicated by the same numerals.

Figure 7:
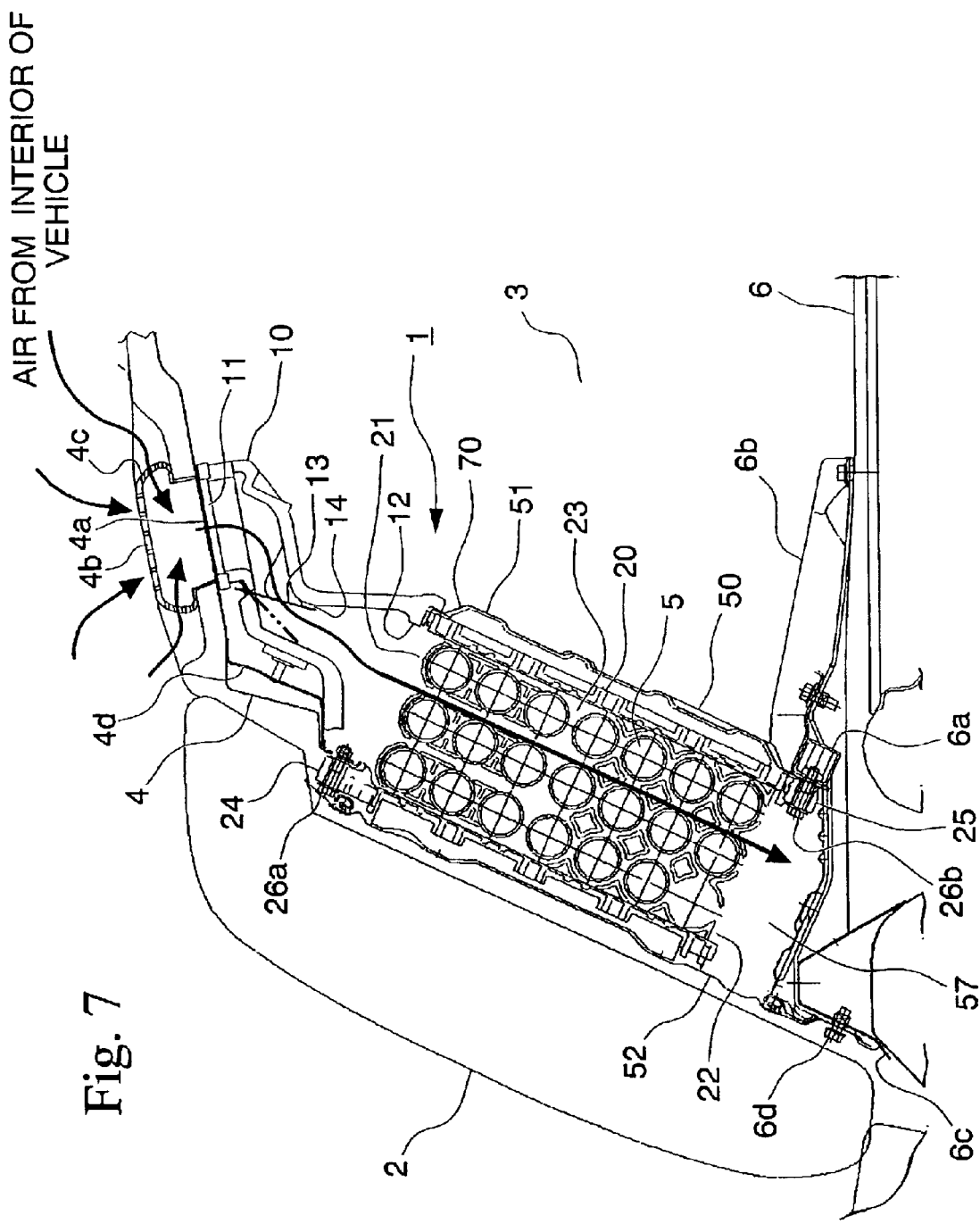
FIG. 7 is a cross-sectional view showing a battery accommodated in the high voltage electrical packaging cooling device in a longitudinal direction.
Figure 9:
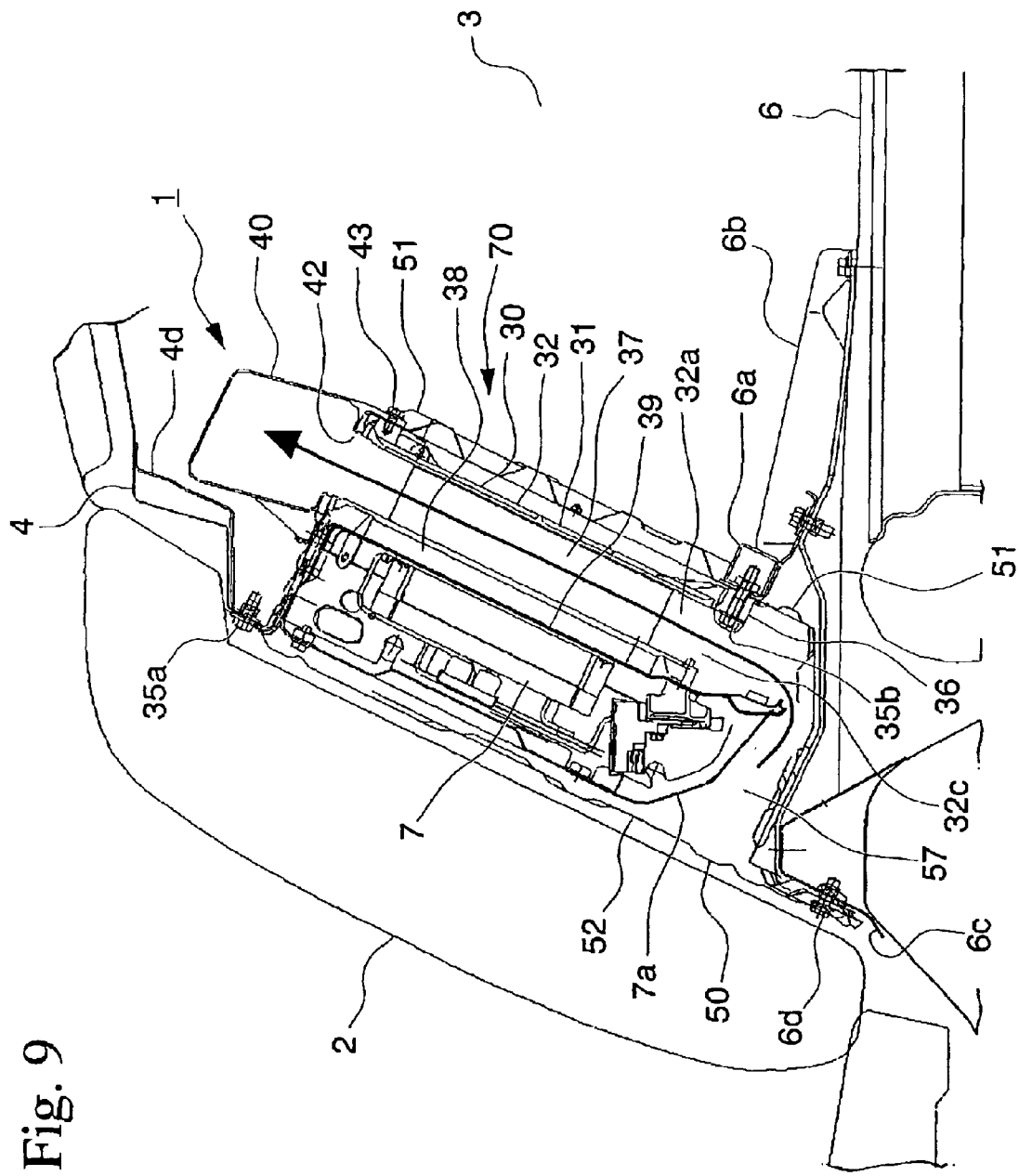
FIG. 9 is a cross-sectional view showing an inverter accommodated in the high voltage electrical packaging cooling device in a longitudinal direction.

The high voltage electrical packaging cooling device 1, as shown in FIGS. 7 and 9, is placed between the rear seat 2 and the trunk 3 in a standing state with its upper portion inclined towards the trunk 3 to some extent so as to fit with the backrest of the rear seat 2.

The high voltage electrical packaging cooling device 1 includes the air-intake duct 10, the battery box 20, the heat sink case 30, the air-exhaust duct 40, the exterior box 50, and the fan 60.

The air-intake duct 10 may be formed of an expandable resin, such as expandable polypropylene, which is light and has good heat insulating properties.

Figure 2:
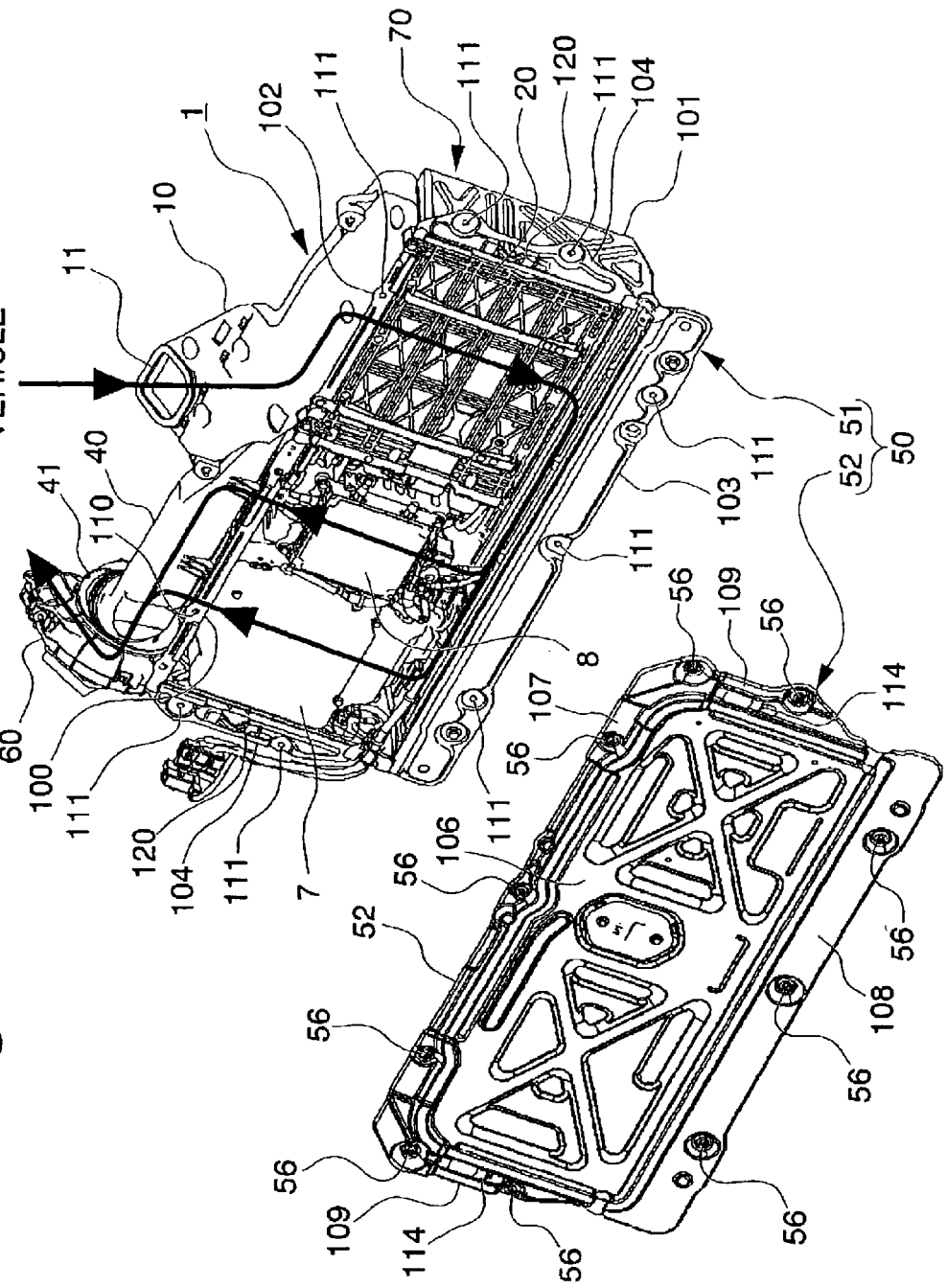
FIG. 2 is an exploded perspective view showing the high voltage electrical packaging cooling device from a front side of a vehicle.

As shown in FIGS. 2 and 7, the cooling air inlet 11 is formed at an upper end portion of the air-intake duct 10, and the lower opening 12, which is oblong and larger than the cooling air inlet 11, is formed at a lower end portion of the air-intake duct 10.

The cooling air inlet 11 of the air-intake duct 10 is connected to a suction grill 4b via an opening 4a formed at the rear tray 4 of the vehicle. The suction grill 4b includes a number of suction openings 4c at the upper and side surfaces thereof which are exposed to the interior of the vehicle so that air in the vehicle may be introduced into the air-intake duct 10 through the openings 4c. Note that since the suction openings 4c are provided at the side surfaces as well as the upper surface thereof, the air in the vehicle can be introduced into the air-intake duct 10 even if the openings at the upper surface are closed by an object put on the suction grill 4b.

Also, the shutter 13 is disposed in the air-intake duct 10 in the vicinity of the cooling air inlet 11. The shutter 13, which may be made of an ethylene-propylene rubber (EPDM), is rotatably disposed with its upper portion as its center of rotation. The shutter 13 generally hangs down due to its weight, and as indicated by the solid line in FIG. 7, it closes the cooling air passage by contacting a valve seat 14 which is disposed in the middle of the air-intake duct 10. When a negative pressure is generated downstream of the shutter 13, the shutter 13 rotates upwardly as indicated by the dotted line, and separates from the valve seat 14, and the cooling air passage is opened.

Figure 6:
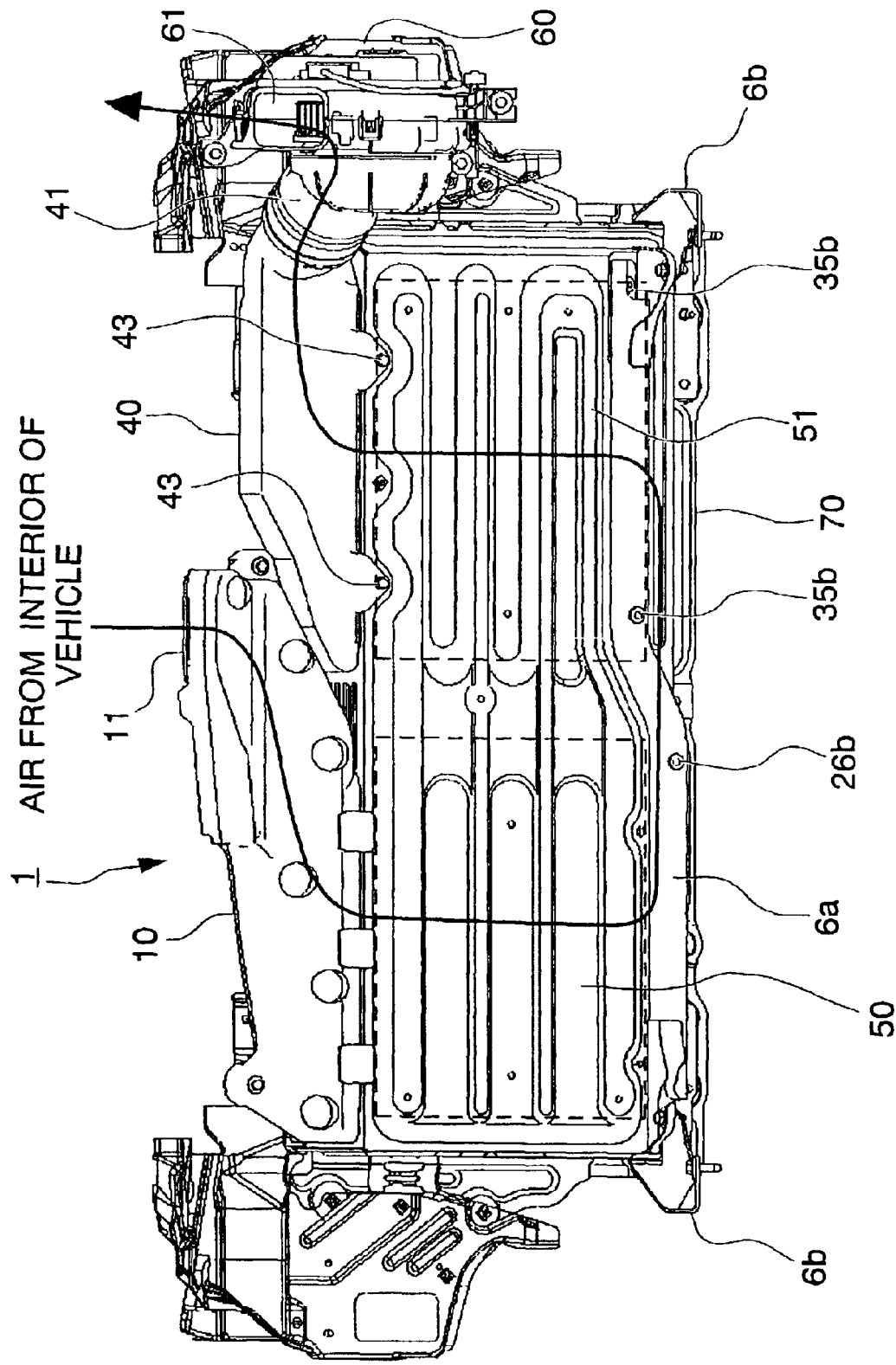
FIG. 6 is a back elevational view showing the high voltage electrical packaging cooling device from the back side of the vehicle.

As shown in FIGS. 2, 6, and 9, the air-exhaust duct 40 includes the cooling air outlet 41 at the upper rear portion, and two lower openings 42 at a lower end portion thereof. The fan 60 for exhausting the cooling air in the air-exhaust duct 40 is disposed at the cooling air outlet 41, and the cooling air from the outlet 61 of the fan 60 is exhausted to the trunk 3 via a duct which is not shown in the figures.

The air-intake duct 10 and the air-exhaust duct 40 communicate via a cooling air passage formed by the battery box 20, the heat sink case 30, and the exterior box 50.

Figure 3:
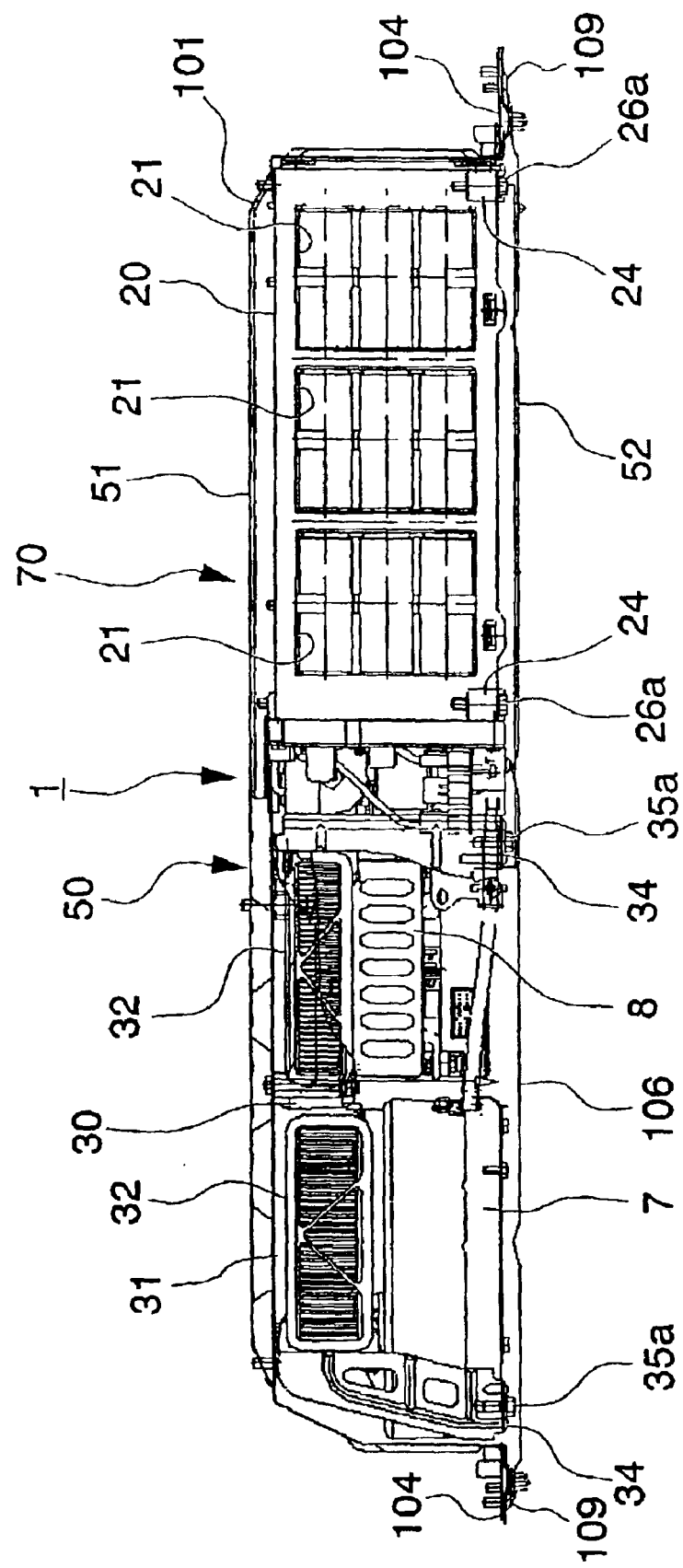
FIG. 3 is a cross-sectional view showing the high voltage electrical packaging cooling device in a transverse direction.
Figure 4:
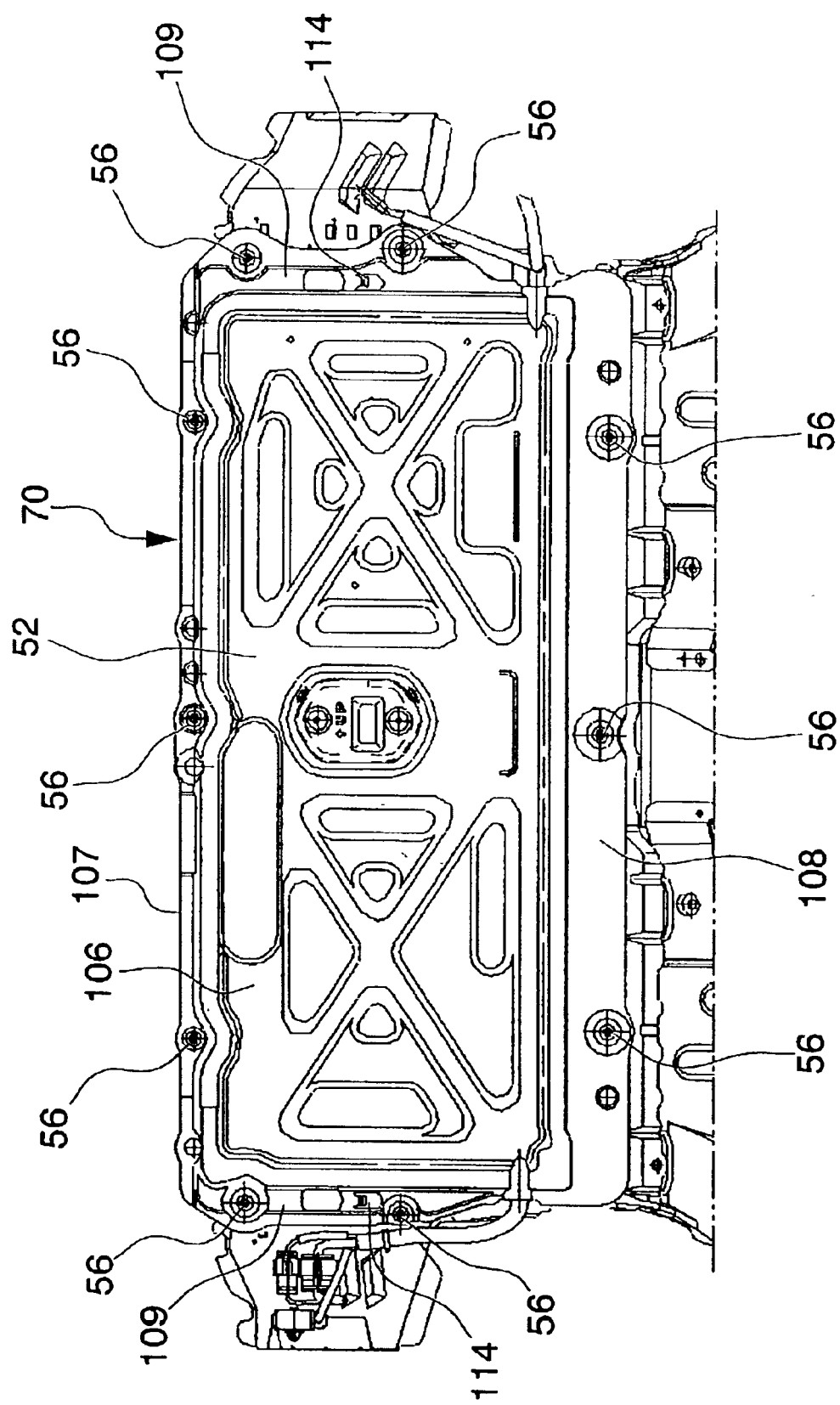
FIG. 4 is an elevational view showing the high voltage electrical packaging cooling device from the front side of the vehicle.

The battery box 20 may be formed by a material which is light and has high rigidity, such as fiber reinforced plastics (FRP). As shown in FIGS. 3, and 7, the battery box 20 has a box shape including a plurality of upper openings 21 and lower openings 22 at the upper and the lower sides thereof. The internal space 23 of the battery box 20 functions as a passage for the cooling air as well as a space for accommodating a number of batteries 5. The cooling air flows into the internal space 23 of the battery box 20 from the upper openings 21, and exchanges heat with the batteries 5 while passing between the batteries 5. Then, the cooling air is exhausted to the outside of the battery box 20 via the lower openings 22.

Figure 8:
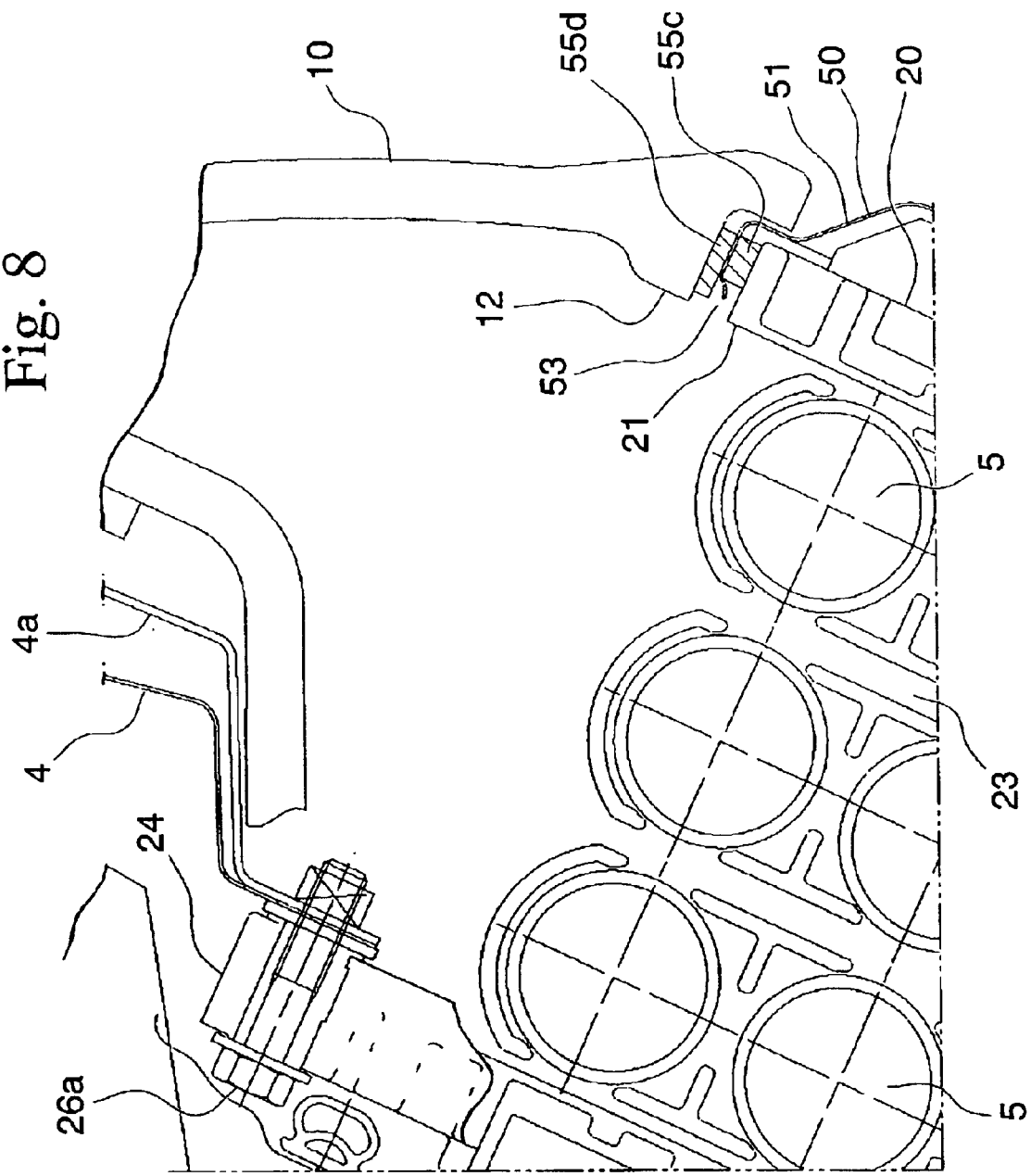
FIG. 8 is an enlarged view showing the main portion of FIG. 7.

Also, a pair of fixing bosses 24 and 25 is disposed at the upper front portion and the rear back portion of the battery box 20. As shown in FIGS. 7 and 8, the two fixing bosses 24 and 24 located above are fixed to the rear tray 4 and a reinforcing member 4d by a bolt 26a. The two fixing bosses 25 and 25 located below are, as shown in FIGS. 6 and 7, fixed to a pipe frame 6a disposed in the trunk 3 along the width of the body by a bolt 26b. The pipe frame 6a is fixed between a pair of side frames 6b and 6b, which are fixed to the right hand side and the left hand side of a vehicle floor 6 in the trunk 3, so as to be located slightly above the vehicle floor 6. As a result, two portions at the upper front side and two portions at the lower back side of the battery box 20 are fixed to the body of the vehicle and firmly supported.

Figure 10:
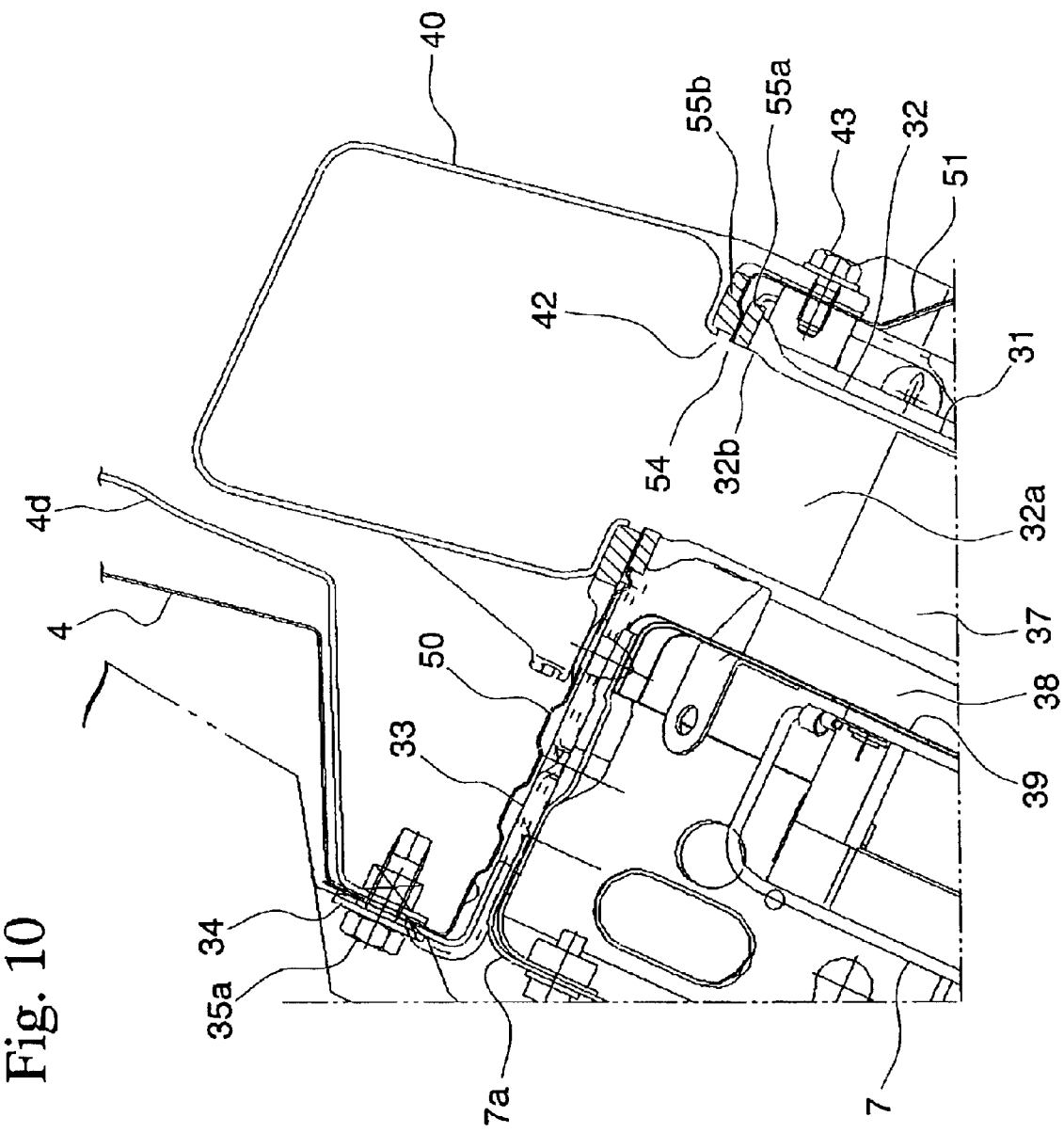
FIG. 10 is an enlarged view showing main portions in FIG. 9.

The heat sink case 30 may be made of a material having a light weight and high rigidity, such as magnesium. As shown in FIGS. 3, 9, and 10, the heat sink case 30 includes a main body 31 formed by two box shaped casings 32 and 32, which extend in the up and down direction and are integrally coupled being disposed parallel to each other at the right and left hand sides of the heat sink case 30. The rear surface of the main body 31 is disposed on substantially the same plane of the rear surface of the battery box 20. Arms 33 are extended in the front direction from both sides of the upper front portion of the main body 31, and the end portion of each of the arms 33 is bent upwardly to be used as a fixing flange 34. The front surface of the fixing flange 34 is disposed on substantially the same plane as the front surface of the fixing boss 24 used for the battery box 20, and the fixing flange 34 is fixed to the above-mentioned rear tray 4 and the reinforcing member 4a thereof by a bolt 35a. Also, fixing bosses 36 are disposed at both ends of the lower back side of the main body 31, and the fixing bosses 36 are fixed to the pipe frame 6a mentioned above by bolts 35b. As a result, two portions at the upper front side and two portions at the lower back side of the heat sink case 30 are fixed to the body of the vehicle and firmly supported.

The internal space 32a in each of the casings 32 and 32 functions as a passage for the cooling air. Also, a number of radiation plates (heat sinks) 37 which protrude from the inner wall surface of a heat transfer base 38 and extend in the up and down direction are disposed in the space 32a of each of the casings 32. The heat transfer base 38 is disposed outside of the front of the main body 31 where the radiation plates 37 are placed, and a tray 39 which covers substantially the entire front portion of the main body 31 is fixed to the heat transfer base 38. The upper end of the tray 39 is disposed inside the arm 33, and the lower end of the tray 39 extends downwardly with respect to the main body 31.

Figure 5:
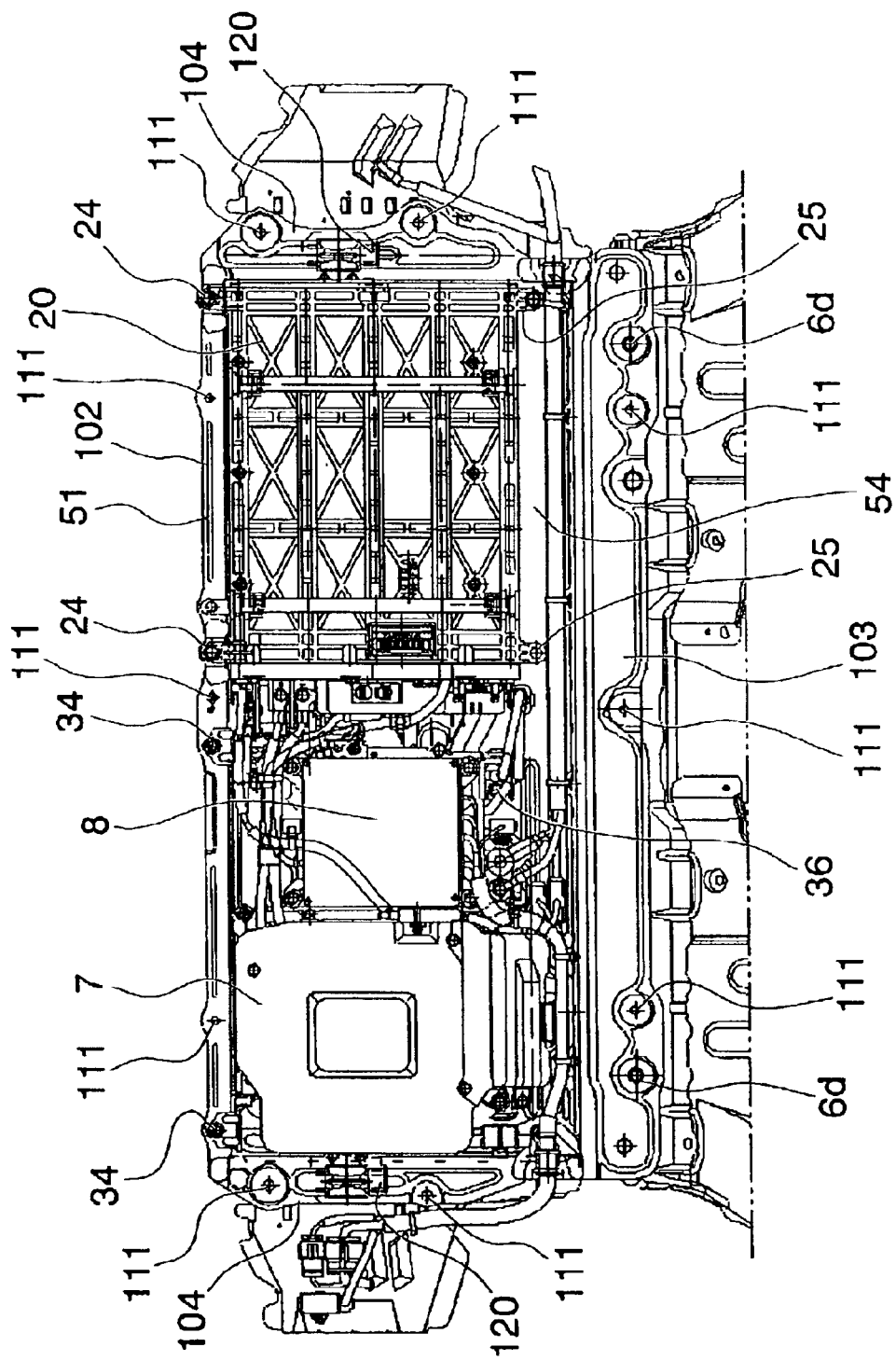
FIG. 5 is an elevational view showing the structure of the high voltage electrical packaging cooling device from which a part thereof is taken out, viewed from the front side of the vehicle.

As shown in FIGS. 3 and 5, an inverter 7, which converts alternating current into direct current, is attached to the tray 39. A DC/DC converter 8 lowers the voltage of the direct current converted by the inverter 7. Note that in FIG. 9, the symbol 7a indicates a hood, which is attached to the inverter 7 to cover the inverter 7. The periphery of the hood 7a is engaged with the outside portion of the tray 39, and the inverter 7 is surrounded by the tray 39 and the hood 7a. The DC/DC converter 8 is also provided with another hood having the same function and the structure as the hood 7a. In the heat sink case 30 having the above-mentioned configuration, heat generated by the inverter 7 and the DC/DC converter 8 is transmitted to the radiation plates 37 via the heat transfer base 38. Then, heat is exchanged between the cooling air, which flows through the internal space 32a of the casing 32, and the radiation plates 37.

The exterior box 50 having a box shape may be made of a thin metal, and it may contain the battery box 20, the heat sink case 30, the inverter 7, the DC/DC converter 8, an electrical control unit (ECU), and so forth. Note that in this embodiment, the battery box 20, the heat sink case 30, and the exterior box 50 form the high voltage electrical packaging box 70.

As shown in FIG. 2, the exterior box 50 which forms a part of the high voltage electrical packaging box 70 includes a case member 51 having a rectangular solid shape having a rectangular opening portion 100 on a surface thereof, and a cover member 52 which is detachably attached to the case member 51 so as to cover the opening portion 100.

The case member 51 is disposed in an inclined state with respect to the horizontal plane so that the opening portion 100 faces the rear seat 2 and that the case member 51 inclines along the back of the rear seat 2. The case member 51 includes a case main portion 101, an upper flange portion 102, a lower flange portion 103, and a pair of side flange portions 104. The case main portion 101 has a substantially a rectangular solid shape and includes the above-mentioned rectangular opening portion 100 which entirely opens the one surface thereof. The upper flange portion 102 extends upwardly from an upper periphery of the case main portion 101 at the opening portion 100 side. The lower flange portion 103 extends downwardly from a lower periphery of the case main portion 101 at the opening portion 100 side. Each of the pair of the side flange portions 104 extends from a respective side periphery of the case main portion 101 at the opening portion 100 side.

An opening 53, which has the same shape and size as the upper opening 21, is formed on the upper surface of the case member 51 at a position corresponding to the upper opening 21 of the battery box 20 (refer to FIG. 8). Also, an opening 54, which has the same shape and size as the upper opening 32b, is formed on the upper surface of the case member 51 at a position corresponding to the upper opening 32b of each of the casings 32 of the heat sink case 30 (refer to FIG. 10).

As shown in FIG. 10, the periphery of the opening 54 of the case member 51 is positioned on the periphery of the upper opening 32b of the casing 32 via a sealing member 55a. Also, the periphery of the lower opening 42 of the air-exhaust duct 40 is positioned on the periphery of the opening 54 of the case member 51 via a sealing member 55b. The air-exhaust duct 40 is fixed to the case member 51 using bolts 43 so as to seal and connect the upper opening 32b of the heat sink case 30, the opening 54 of the case member 51, and the lower opening 42 of the air-exhaust duct 40.

On the other hand, as shown in FIG. 8, the periphery of the opening 53 of the case member 51 is positioned on the periphery of the upper opening 21 of the battery box 20 via a sealing member 55c. Also, the periphery of the lower opening 12 of the air-intake duct 10 is positioned on the periphery of the opening 53 of the case member 51 via a sealing member 55d. The air-intake duct 10 is fixed to the battery box 20 using a fixing means not shown in the figure so as to seal and connect the upper opening 21 of the battery box 20, the opening 53 of the case member 51, and the lower opening 12 of the air-intake duct 10.

As shown in FIGS. 7 and 9, the case member 51 is tightly sandwiched between the above-mentioned joint portion of the fixing boss 25 below the battery box 20 and the pipe frame 6a, and the joint portion of the fixing boss 36 of the heat sink case 30 and the pipe frame 6a. Also, the lower flange portion 103 of the case member 51 is fixed to a support frame 6c, which is disposed along the width direction of the vehicle floor 6, using a bolt 6d.

As shown in FIG. 2, the cover member 52 of the exterior box 50 includes a cover portion 106 at the center, an upper flange portion 107, a lower flange portion 108, and a pair of side flange portions 109. The upper flange portion 107 extends upwardly from an upper periphery of the cover portion 106. The lower flange portion 108 extends downwardly from a lower periphery of the cover portion 106. The pair of side flange portions 109 extend laterally from the side peripheries of the cover portion 106. The cover member 52 covers the opening portion 100 of the case member 51 by the cover portion 106 thereof. Also, the cover member 52 is attached to the case member 51 so that its upper flange portion 107 is engaged with the upper flange portion 102 of the case member 51, the lower flange portion 108 is engaged with the lower flange portion 103, and the side flange portions 109 are engaged with the side flange portions 104.

A screw hole 111 is formed at a predetermined position of each flange portion 102-104 of the case member 51, and a fixing hole which is not shown in the figures is formed in each of the flange portions 107–109 of the cover member 52 at a position corresponding to the screw hole 111.

Figure 11:
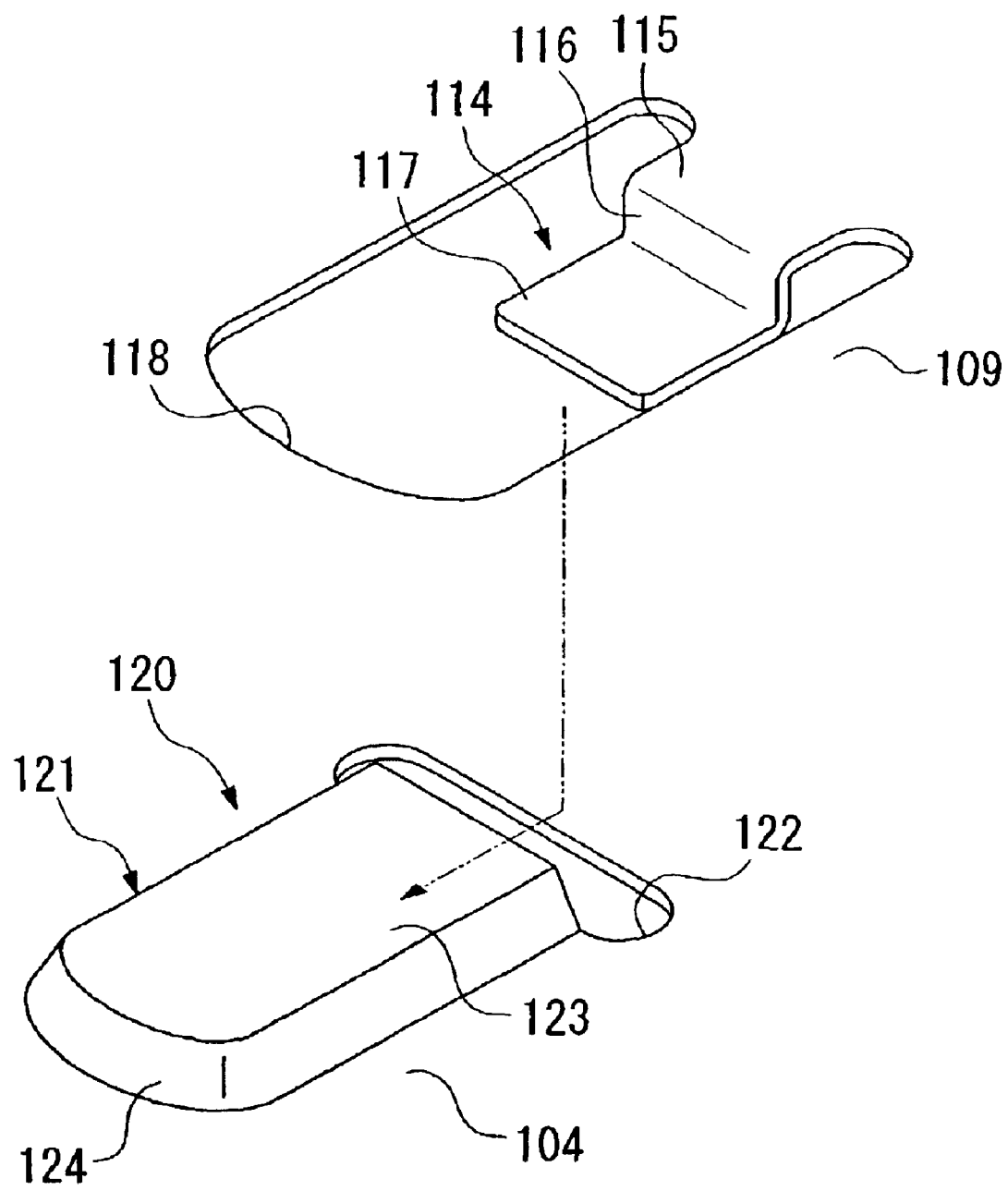
FIG. 11 is a perspective view showing the main portions of a high voltage electrical packaging box structure according to an embodiment of the present invention.
Figure 12:
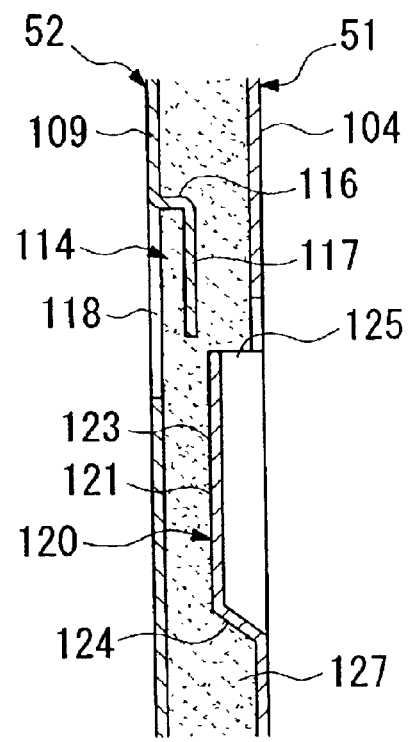
FIG. 12 is a side cross-sectional view showing the main portions of the high voltage electrical packaging box structure according to an embodiment of the present invention.
Figure 13:
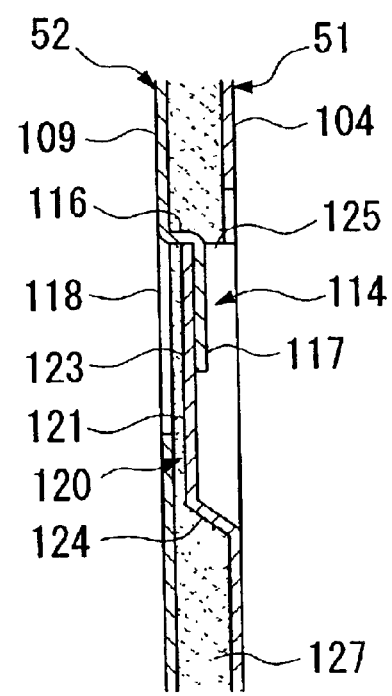
FIG. 13 is a side cross-sectional view showing the main portions of the high voltage electrical packaging box structure according to an embodiment of the present invention.

Also, a pawl member 114 is provided at each of the pair of the side flange portions 109 of the cover member 52 at a predetermined position located at substantially the center in the height direction. The pawl member 114 may be integrally formed with the side flange portion 109 by being punched out from the side flange portion 109 by a press working process and then being bent. As shown in FIGS. 11–13, the pawl member 114 includes a base plate portion 115, a middle plate portion 116, and a front plate portion 117. The base plate portion 115 extends downwardly along the side flange portion 109. The middle plate portion 116 is bent from the end of the base plate portion 115 and extends in a direction perpendicular to the side flange portion 109 (i.e., the direction to be attached to the case member 51). The front plate portion 117 is bent from an end of the middle plate portion 116 and extends downwardly along the side flange portion 109. The pawl member 114 is surrounded by a hole 118 which is necessary to form the pawl member 114.

A receiving member 120 which is engaged with the pawl member 114 is provided with each of the pair of the side flange portions 104 of the case member 51 at a predetermined position located at substantially the center in the height direction thereof. The receiving member 120 may be formed by being partially punched out from the side flange portion 104 by a press working process and being partially raised upwardly towards the cover member 52. The receiving member 120 includes a raised portion 121 and a hole 122. The raised portion 121 has the shape of a bead and is raised from the side flange portion 104. The hole 122 is formed so as to separate an upper end portion of the raised portion 121 from the side flange portion 104. The raised portion 121 includes a top plate portion 123, and a connecting portion 124. The top plate portion 123 is formed parallel to the side flange portion 104, and the connecting portion 124 connects portions other than the upper portion of the top plate portion 123 to the side flange portion 104 so that an opening concave portion 125, the upper end of which is opened between the top plate portion 123 and the side flange portion 104, is formed.

In a state where a sealing member 127 having elasticity formed of, for instance, EPDM rubber, is placed between the periphery of the opening portion 100 of the case member 51 and the cover member 52 as shown in FIG. 12, the front plate portion 117 of the pawl member 114, which is formed on the side flange portions 109 of the cover member 52 is inserted into the opening concave portion 125 of the receiving member 120, which is formed on the side flange portions 104 of the case member, until the middle plate portion 116 of the pawl member 51 is engaged with the upper portion of the top plate portion 123 of the receiving member 120 while the sealing member 127 is compressed as shown in FIG. 13. In this manner, the pawl member 114 is engaged with the receiving member 120 and cannot be pulled out therefrom other than in the upward direction. That is, the cover member 52 is temporarily fixed to the case member 51. As a result, the cover member 52 is not detached from the case member 51 if a worker removes his hands from the cover member 52. Moreover, in the temporarily fixed state, the position of each of the flange portions 102–104 of the cover member 52 matches the position of the corresponding flange portions 107–109 of the case member 51, and hence, the position of the fixing holes (not shown in the figures) of the cover member 52 matches the position of the corresponding screw holes 111 of the case member 51. In the above-mentioned temporarily fixed state, a screw 56 is inserted into the fixing hole (not shown in the figures) of the cover member 52 and is screwed into the screw hole 111 of the case member 51 to attach the cover member 52 to the case member 51 while compressing and deforming the sealing member 127.

On the other hand, when the cover member 52 is detached from the case member 51, the screw 56 is unscrewed from the screw hole 111, however, since the pawl member 114 formed on the side flange portions 109 of the cover member 52 is engaged with the receiving member 120 formed on the side flange portions 104 of the case member 51 so as to temporarily fix the cover member 52 to the case member 51, the cover member 52 will not drop from the case member 51 even if all of the screws 56 are unscrewed. When a worker removes the cover member 52 from the case member 51, he pulls the cover member 52 upwardly with respect to the case member 51 to separate the pawl member 114 from the opening concave portion 125 of the receiving member 120 to release the engagement thereof.

In the exterior box 50, which is formed by the case member 51 and the cover member 52 attached to the case member 51 as explained above, the lower end of the battery box 20 is separated from the inner bottom surface of the exterior box 50 (refer to FIG. 7), and the lower end of the tray 39 provided with the heat sink case 30 and the lower end of the main body 31 of the heat sink case 30 are also separated from the inner bottom surface of the exterior box 50 (refer to FIG. 9). Also, the internal space of the closed exterior box 50 functions as the cooling air passage 57 which connects the lower opening 22 of the battery box 20 with the lower opening 32c of the casings 32 of the heat sink case 30.

In the high voltage electrical packaging cooling device 1 having the above-mentioned configuration, since the pressure inside the air-intake duct 10 becomes negative when the fan 60 is rotated, the shutter 13 rotates upwardly and separates from the valve seat 14 to open the passage for the cooling air. As a result, air inside the vehicle flows into the air-intake duct 10 as cooling air from the suction openings 4c of the suction grill 4b. The cooling air then flows into the internal space 23 of the battery box 20 from the lower opening 12 of the air-intake duct 10 via the upper opening 21 of the battery box 20, and further flows downwardly between the batteries 5 placed in the internal space 23. At that time, the cooling air (from the interior of the vehicle) flows through the internal space 23 exchanging heat with the batteries 5, and as a result, the batteries 5 are cooled down whereas the temperature of the cooling air is increased to some extent. Since the batteries 5 are controlled to maintain a low temperature, the degree of the increase in the temperature of the cooling air is small, and the air can still sufficiently cool down the inverter 7 and the DC/DC converter 8. The cooling air used for cooling down the batteries 5 passes into the exterior box 50 from the lower opening 22 of the battery box 20.

Since the exterior box 50 is closed and the cooling air can flow through only the internal space 32a of the casings 32 of the heat sink case 30, the cooling air passing into the exterior box 50 from the battery box 20 passes through the cooling air passage 57 and flows into the internal space 32a of the casings 32 via the lower opening 32c of the casings 32. Then, the cooling air ascends in the internal space 32a passing through the radiation plates 37. At this time, heat is exchanged between the cooling air and the radiation plates 37. As a result, the radiation plates 37 are cooled down whereas the temperature of the cooling air increases. Since the heat generated at the inverter 7 and the DC/DC converter 8 is transmitted to the radiation plates 37 in the casings 32, the inverter 7 and the DC/DC converter 8 are also cooled down when the radiation plates 37 are cooled down.

The cooling air, the temperature of which is increased due to the heat exchange between the radiation plates 37, passes into the air-exhaust duct 40 from the upper opening 32b of the casings 32 via the lower opening 42 of the air-exhaust duct 40, and then is sucked by the fan 60 via the cooling air outlet 41 of the air-exhaust duct 40. After this, the cooling air is exhausted into the trunk 3 from the outlet 61 of the fan 60 via a duct which is not shown in the figures.

According to the high voltage electrical packaging box structure of the embodiment of the present invention mentioned above, even if a worker does not support the weight of the cover member 52 when the screws 56 are unscrewed to remove the cover member 52 from the case member 51, the cover member 52 will not drop and be damaged since the pawl member 114 formed on the cover member 52 is engaged with the receiving member 120 formed on the case member 51. That is, the cover member 52 can be temporarily fixed to the case member 51, prior to attaching the cover member 52 to the case member 51 using the screws 56, by moving the cover member 52 downwardly while adjusting the position thereof with respect to the case member 51, and engaging the pawl member 114 formed on the cover member 52 with the receiving member 120 formed on the case member 51. Accordingly, the worker can perform screwing and unscrewing operations using the screws 56 without supporting the weight of the cover member 52 during the operations. Therefore, the workability and efficiency in the operation of attaching/detaching the cover member 52 to/from the case member 51 can be improved.

Also, since the receiving member 120 is formed on the side flange portions 104 of the case member 51, the receiving member 120 can be disposed at a position separated from the cooling air passage 57, which is enclosed by the case member 51 and the cover member 52. Accordingly, there is no danger that the cooling air passage 57 will be opened to the outside by the receiving member 120. Similarly, since the pawl member 114 is provided on the side flange portions 109 of the cover member 52, the pawl member 114 can be disposed at a position separated from the cooling air passage 57 which is enclosed by the case member 51 and the cover member 52. Accordingly, there is no danger that the cooling air passage 57 will be opened to outside by the pawl member 114. Therefore, when the high voltage electrical packaging box structure is applied to the high voltage electrical packaging cooling device 1, the internal temperature of which is reduced by the cooling air flowing through the cooling air passage 57 as explained above, the flow of the cooling air in the cooling air passage 57 is not disrupted and the cooling efficiency is not lowered.

Moreover, since the receiving member 120 formed on the side flange portions 104 has the shape of a bead raised from the side flange portions 104, the receiving member 120 reinforces the side flange portions 104. Accordingly, the rigidity of the side flange portions 104 can be increased.

Furthermore, since the sealing member 127 having elasticity is provided between the periphery of the opening portion 100 of the case member 51 and the cover member 52, the cover member 52 is subject to a force pushing it away from the case member 51 due to the elasticity of the sealing member 127 when the cover member 52 is temporarily fixed to the case member 51 by the pawl member 114 and the receiving member 120. However, since the pawl member 114 and the receiving member 120 are disposed at substantially the center in the height direction of the case member 51 and the cover member 52, respectively, the force from the seating member 127 can be evenly received. Accordingly, it becomes possible to prevent the upper end or lower end of the cover member 52 from being significantly raised during the temporary fixing process. Accordingly, it becomes possible to further increase the efficiency in the screwing process using the screws 56.

Although a case in which the pawl member 114 is formed with the cover member 52 and the receiving member 120 is formed with the case member 51 is explained above as the embodiment of the present invention, it is possible to form the receiving member 120 on the cover member 52 and the pawl member on the case member 51. That is, it is sufficient if the pawl member 114 is formed on one of the case member 51 and the cover member 52 and the receiving member 120 is formed on the other one of the case member 51 and the cover member 52.

Having thus described exemplary embodiments of the invention, it will be apparent that various alterations, modifications, and improvements will readily occur to those skilled in the art. Such alterations, modifications, and improvements, though not expressly described above, are nonetheless intended and implied to be within the spirit and scope of the invention. Accordingly, the foregoing discussion is intended to be illustrative only; the invention is limited and defined only by the following claims and equivalents thereto.

What is claimed is:

1. A high voltage electrical packaging box structure, comprising:
   a case member having an opening portion, said case member being installed so that a plane of said opening portion is inclined with respect to a horizontal plane; and
   a cover member which is detachably attached to said case member so as to cover said opening portion of said case member; wherein
   a pawl member is provided on one of said case member and said over member, and
   a receiving member, which is engaged with said pawl member, is provided on the other one of said case member and said cover member, said receiving member comprising a raised portion which includes a top plate portion and a connecting portion to form an open concave portion for inserting and engaging said pawl member.

2. A high voltage electrical packaging box structure according to claim 1, wherein said case member further comprises a flange portion extending in a lateral direction, and one of said pawl member and said receiving member is provided said flange portion.

3. A high voltage electrical packaging box structure according to claim 1, wherein said cover member further comprises a flange portion extending in a lateral direction, and one of said pawl member and said receiving member is provided on said flange portion.

4. A high voltage electrical packaging box structure according to claim 1, wherein said case member further comprises a flange portion extending in a lateral direction, and said receiving member is provided on said flange as a bead.

5. A high voltage electrical packaging box structure according to claim 1, wherein said cover member further comprises a flange portion extending in a lateral direction, and said receiving member is provided on said flange as a bead.

6. A high voltage electrical packaging box structure according to claim 1, further comprising:

a sealing member having elasticity which is disposed between a periphery of said opening portion of said case member and said cover member.

7. A high voltage electrical packaging box structure according to claim 6, wherein said pawl member and said receiving member are disposed at substantially a central position in a height direction of said case member and of said cover member.

8. A high voltage electrical packaging box structure according to claim 1, wherein said high voltage electrical packaging box structure is placed between a rear seat and a trunk of a vehicle.

9. A high voltage electrical packaging box structure according to claim 8, wherein said high voltage electrical packaging box structure is applied to cooling device.

* * * * *